United States Patent
Venkatesan et al.

(10) Patent No.: US 6,383,885 B1
(45) Date of Patent: May 7, 2002

(54) BIPOLAR TRANSISTOR WITH IMPROVED REVERSE BREAKDOWN CHARACTERISTICS

(75) Inventors: Vasudev Venkatesan, Chandler; Patrice Parris, Phoenix, both of AZ (US)

(73) Assignee: Motorola, Inc., Schumburg, IL (US)

( * ) Notice: Subject to any disclaimer, the term of this patent is extended or adjusted under 35 U.S.C. 154(b) by 0 days.

(21) Appl. No.: 09/427,824

(22) Filed: Oct. 27, 1999

(51) Int. Cl.$^7$ ............................................ H01L 21/8238
(52) U.S. Cl. ........................................ 438/309; 257/565
(58) Field of Search ................................. 438/309, 137, 438/138, 268, 273, 545, 546; 257/565, 592

(56) References Cited

U.S. PATENT DOCUMENTS

| | | | |
|---|---|---|---|
| 5,321,281 A | * 6/1994 | Yamaguchi et al. | 257/212 |
| 5,565,701 A | * 10/1996 | Zambrano | 257/500 |
| 5,897,355 A | * 4/1999 | Bulucea et al. | 438/273 |
| 6,137,154 A | * 10/2000 | Capilla | 257/566 |

* cited by examiner

*Primary Examiner*—David Nelms
*Assistant Examiner*—Quoc Hoang
(74) *Attorney, Agent, or Firm*—Robert L. King

(57) ABSTRACT

A bipolar transistor (10) in an IC includes a semiconductor wafer defining a collector area (14) with a first conductivity type, a base area (20) with a second conductivity type formed in the collector area (14), and an emitter formed in the base area. A field oxide is positioned on the surface of the semiconductor wafer surrounding the emitter (30) and substantially covering the base area (20) and an implant of the second conductivity type is positioned in the base area (20) between and spaced from the emitter (30) and the outer periphery of the base area (20). The implant further has a heavier concentration of the second conductivity type than the base area to compensate for loss of the second conductivity type under the field oxide and to separate the transistor current path from the breakdown path, which improves the collector to emitter breakdown voltage (BVCEO) while still maintaining a high beta.

11 Claims, 3 Drawing Sheets

BIPOLAR TRANSISTOR WITH IMPROVED REVERSE BREAKDOWN CHARACTERISTICS

FIELD OF THE INVENTION

This invention relates to bipolar transistors in integrated circuits and, more particularly, to a bipolar transistor with improved collector to emitter breakdown voltage while maintaining a high beta.

BACKGROUND OF THE INVENTION

Advanced automotive, consumer and industrial applications are driving integration of power, Ultra High Voltage Complementary Metal Oxide Semiconductor (UHV CMOS) and bipolar analog functions with microcontrollers and embedded non-volatile memory. Hyperintegration technology (MOTOROLA, INC. technology) is based on a Complementary Metal Oxide Semiconductor (CMOS) platform and integrates power, bipolar devices with EEPROM and flash Electrically Erasable and Programmable Read Only Memory (EEPROM). This technology provides an integrated system solution for automotive electronics applications such as airbags, power window and power seat modules. Bipolar transistors in the Hyperintegration technology are used primarily in the input/output ports and the voltage regulator circuit. However, because of the integration and the reduction in size of the various components, process induced variations in the various components are relatively common. Also, the collector to emitter breakdown voltage (BVCEO) is usually much less than the collector to base breakdown voltage (BVCBO) and it is desirable to have the BVCEO approach or equal the BVCBO.

It is highly desirable to provide apparatus which overcomes these problems by minimizing process induced variations and improving the BVCEO while maintaining efficient area usage and which is inexpensive and easy to install and use.

A primary purpose of the present invention is to integrate a stable, low-cost bipolar transistor in a conventional CMOS process.

DESCRIPTION OF THE DRAWINGS

Figure 1:
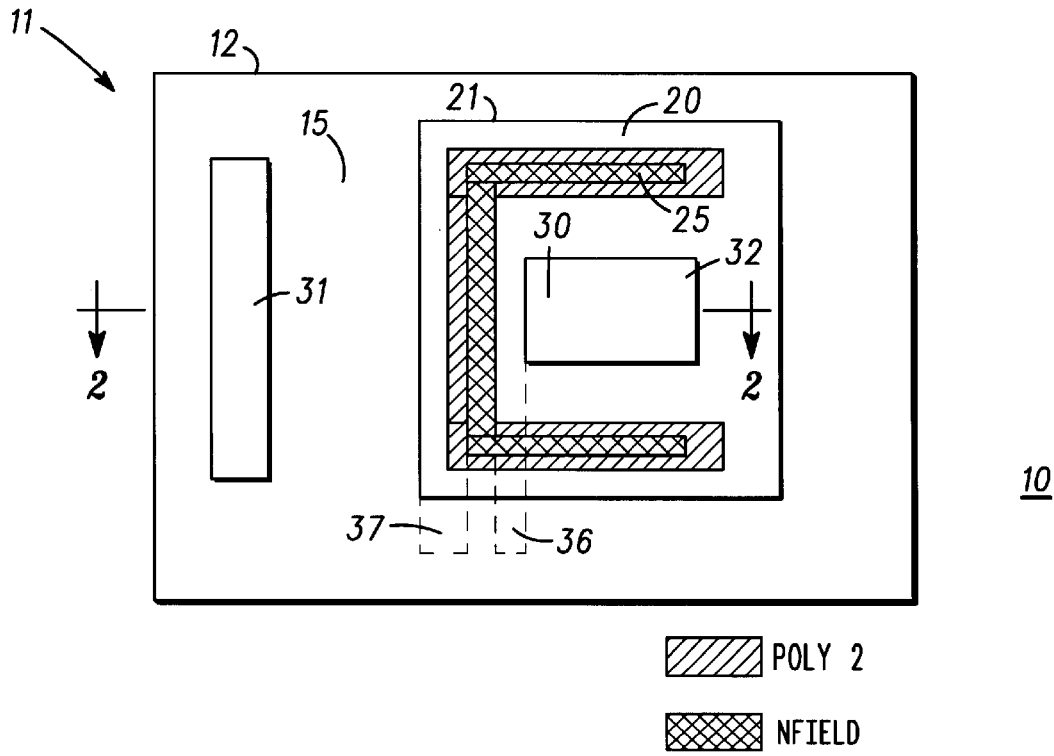
FIG. 1 is a simplified view in top plan, portions thereof shown in phantom for clarity, of an improved bipolar transistor in an integrated circuit in accordance with an embodiment of the present invention.

Turning now to the figures, an improved bipolar transistor 10 in accordance with the present invention is illustrated. Bipolar transistor 10 is included in an integrated circuit which is formed on a semiconductor chip, or wafer 11 using any of the standard processes. As will be understood presently, one object of the present invention is to fabricate bipolar transistor 10 during the fabrication of the integrated circuit without necessitating any additional, or as few as possible, steps in the normal process. For example, transistor 10 can be fabricated during a conventional CMOS process. Wafer 11 can be formed with a first type of conductivity or a portion can be doped with material that provides the desired type of conductivity. In this specific embodiment, wafer 11 is doped to provide P-type conductivity and an N-P-N transistor will be described. It will be understood by those skilled in the art, however, that the conductivity type could be changed to provide a P-N-P type of transistor, if desired (with the possibility of requiring some additional process steps). For purposes of this description, it will be assumed that at least the portion of wafer 11 within area 12 (see FIG. 1) is doped for N-type conductivity. Further, the portion has a lower extremity 14 (see FIG. 2) which may be the backside of wafer 11 or may simply be a tub (or active area) formed in wafer 11. In any case, the N doped portion defines a collector area 15 adjacent the surface of wafer 11.

A base area 20 is formed within collector area 14 by doping base area 20 with material that provides a second conductivity type, which in this case is P-type conductivity. Base area 20 has a tub-like shape with an outer periphery 21 and a lower extremity 22. Lower extremity 22 of base area 20 is spaced from lower extremity 14 of collector area 15 by some convenient amount, to allow for vertical current flow in the bipolar transistor as well as for sufficient base-collector breakdown voltage. In this specific embodiment, the thickness of collector area 15, from the surface of wafer 11 to lower extremity 14 is approximately 4.3 $\mu$m. The thickness of base area 20 from the surface of wafer 11 to lower extremity 22 is approximately 1.3 $\mu$m. As will be understood by those skilled in the art, base area 20 is most easily formed by implanting a p-type material, such as Boron, using an implant mask. In a preferred embodiment, a dose of Boron approximately 1.6E13 cm$^{-2}$ is implanted at approximately 120 Kilo electron volts (KeV). As will be understood, the mask and implant procedures are simultaneously used to form other components, or portions thereof, in the integrated circuit.

A generally U-shaped implant 25 is formed in base area 20, with the bight of the U spaced from periphery 21 and extending generally parallel therewith. Here it should be understood that a U-shaped implant is used for convenience in this description and any of a variety of shapes could be used. For different shapes, such as complete circles, ellipses, and the like, it may be necessary to optimize the position of implant 25 relative to the base-emitter junction (i.e. the junction of emitter 30 with base area 20) and the base-collector junction (i.e. the junction of base area 20 with collector area 15). Implant 25 is formed with the same conductivity type as base area 20 but has a heavier concentration, for purposes that will be explained below. Further, implant 25 extends from the surface of wafer 11 into base area 20 approximately 1 $\mu$m. In this preferred embodiment, implant 25 is produced by implanting a dose of approximately 4E13 cm$^{-2}$ of Boron at approximately 25 KeV. Thus, implant 25 has a heavier concentration of impurities, or Boron, than base area 20. Here it should be understood, that implant 25 can be formed at a variety of points in the fabrication process and preferably at some convenient point during which other implants in the integrated circuit are being formed. In this specific embodiment, implant 25 is formed during a standard field implant used in the fabrication of N-channel Metal Oxide Semiconductor Field Effect Transistors (MOSFETs), i.e. no additional steps are required.

In some convenient sequence, an emitter 30 is formed in base area 20, generally within the area defined by U-shaped implant 25. A collector contact 31 is formed in collector area 15 spaced from base area 20 and a base contact 32 is formed in base area 20 spaced from emitter 30. Since emitter 30 and collector contact 31 are both formed by heavily doping with N-type material (N+), they can both generally be formed in the same implant step. Base contact 32 is formed by implanting a heavy dose of P-type material during a different implant step. Here it will be understood that emitter 30, collector contact 31, and base contact 32 are simply heavily doped areas adjacent the surface of wafer 11 and external metal or poly contacts are added in some later step.

Figure 2:
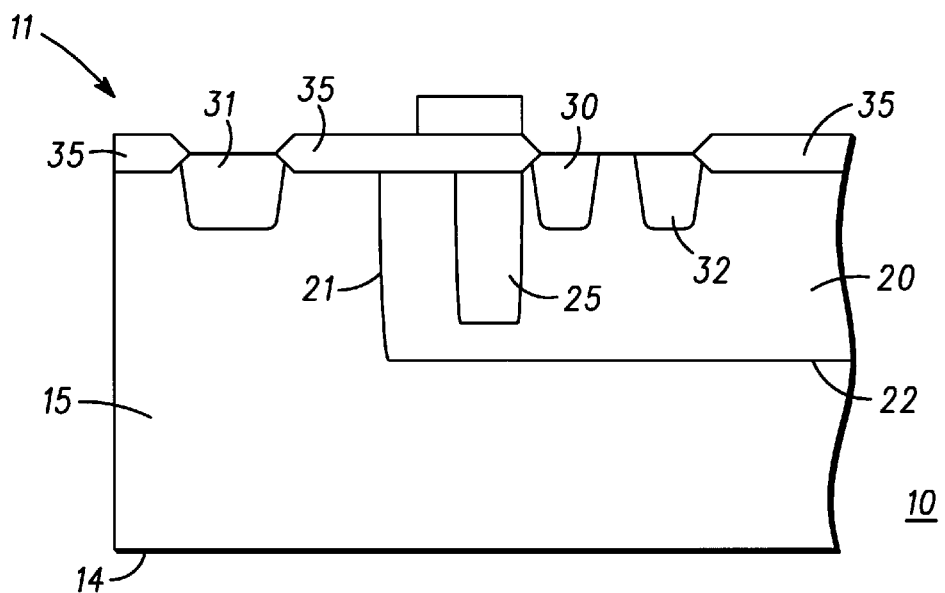
FIG. 2 is a simplified sectional view taken along line 2—2 of FIG. 1.

Referring specifically to FIGS. 1 and 2, it can be seen that emitter 30 and base contact 32 are both positioned within U-shaped implant 25. Emitter 30 is adjacent the bight of U-shaped implant 25 and base contact 32 is spaced from emitter 30 a convenient distance. However, it should be understood that the base and emitter positions could be reversed in some applications. In this specific embodiment, collector contact 31 is positioned in contact with collector area 15 and on the opposite side of implant 25 so that the bight of implant 25 is positioned between emitter 30 and collector contact 31 and the arms of implant 25 extend along opposed sides of emitter 30 generally perpendicular to collector contact 31. Here it should be specifically noted that the shape of implant 25 is not critical as long as the position of implant 25 is within the base area 20 and is spaced appropriately from the base-emitter junction and the base-collector junction.

Also, at some convenient point in the present specific fabrication sequence, a layer of field oxide 35 is deposited or grown on the surface of wafer 11 everywhere except over emitter 30, collector contact 31, and base contact 32. Generally, in the operation of transistor 10, current flows vertically from emitter 30, through base area 20 and into collector area 15 where it makes its way to collector contact 31. The current (or at least the majority) flows vertically because that is the shortest path between emitter 30 and collector area 15. The breakdown path of transistor 10 is generally horizontal between emitter 30 and collector area 15. However, due to material variations, process variations, etc. the breakdown voltage between the emitter and the collector (hereinafter BVCEO is used for convenience) varies. Implant 25 separates the breakdown path from the current path so that the BVCEO approaches or equals the collector-base breakdown voltage BVCBO.

Also, when field oxide 35 is formed on the surface of wafer 11 some of the doping impurities (Boron in this example) are absorbed from base area 20. This reduction in the doping concentration of base area 20 beneath field oxide 35 results in a variation in the breakdown voltage between the emitter and the collector (hereinafter BVCEO is used for convenience). Also, Boron out-diffusion into the field oxide can result in a lateral junction under the field oxide. The extent of this lateral junction affects the characteristics of the transistor and is greatly affected by variations in the fabrication process.

It should be noted that the presence of field oxide 35 is only one instance in which out-diffusion of an implant, such as Boron, occurs. Generally, during a fabrication process there may be several instances in which the device is thermally cycled and/or one or more layers of oxides and/or nitrides are grown and later removed (e.g. some masking steps) with some out-diffusion occurring for each layer and/or thermal cycle. Also, in many instances an oxide separation layer (e.g. a trench filled with oxide) may be positioned over at least one of the junctions in a device. In the past there has been a tendency to increase the distance between the emitter and the collector to increase the BVCEO. However, this solution results in a substantial reduction in the beta of the transistor as well as in a transistor with a larger area.

Thus, in addition to separating the breakdown path from the current path, the introduction of implant 25 compensates for the reduction in the doping concentration of base area 20 by out-diffusion into a layer such as field oxide 35. Implant 25 provides at least a uniform concentration of doping in portions of base area 20 between emitter 30 and collector contact 31. This uniform to increased concentration of doping ensures a higher BVCEO without substantially reducing the beta of transistor 10. It has been found, however, that to maintain a substantially uniform beta while increasing the BVCEO, the spacing (designated 36 in FIG. 1) between emitter 30 and implant 25 has an effect. In addition to spacing 36, implant 25 is spaced from the periphery of base area 15 by a spacing designated 37 in FIG. 1. Here it should be understood that the width of implant 25 may be varied to achieve the above spacings.

Figure 3:
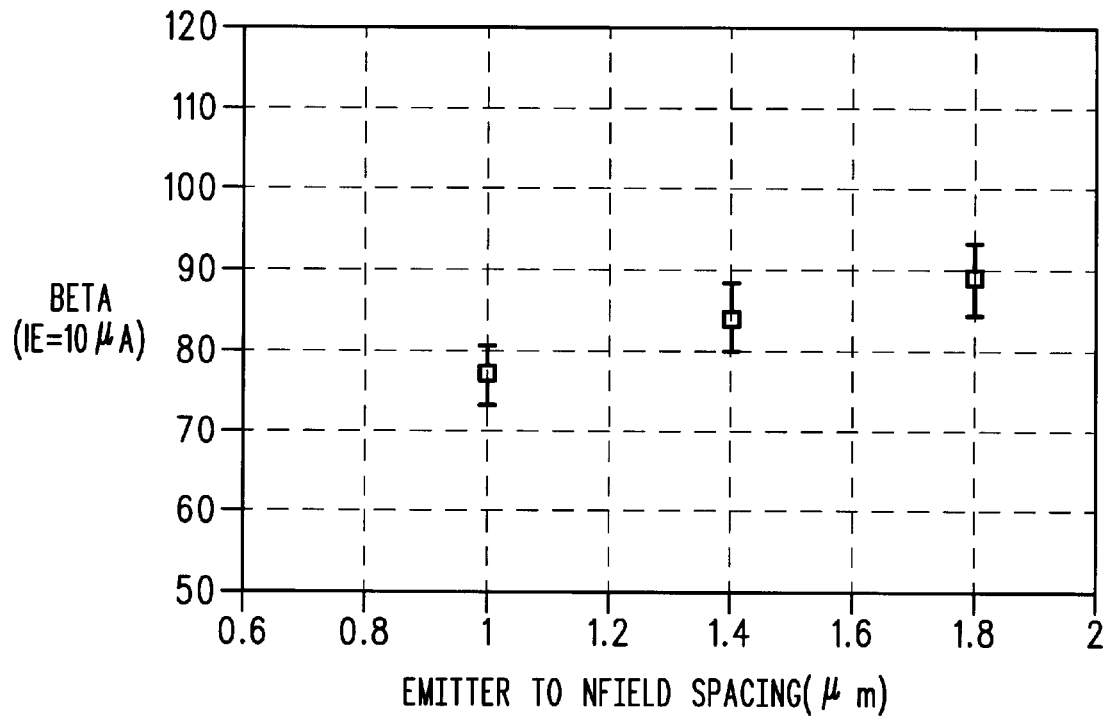
FIGS. 3–6 are graphs illustrating the dependence of various characteristics of the bipolar transistor of FIG. 1 on the spacing between components of the transistor.

Referring to FIG. 3, a graph is illustrated showing the dependence of beta for bipolar transistor 10 on spacing 36 between emitter 30 and implant 25, with spacing 37 held constant at approximately 1.0 $\mu$m. In FIG. 3, spacing 36 between emitter 30 and implant 25 is shown along the horizontal axis. The beta of transistor 10 is shown along the vertical axis and it can be seen to vary slightly as the spacing is increased. For small spacings 36, the emitter injection efficiency of transistor 10 decreases, resulting in a lower beta.

Figure 4:
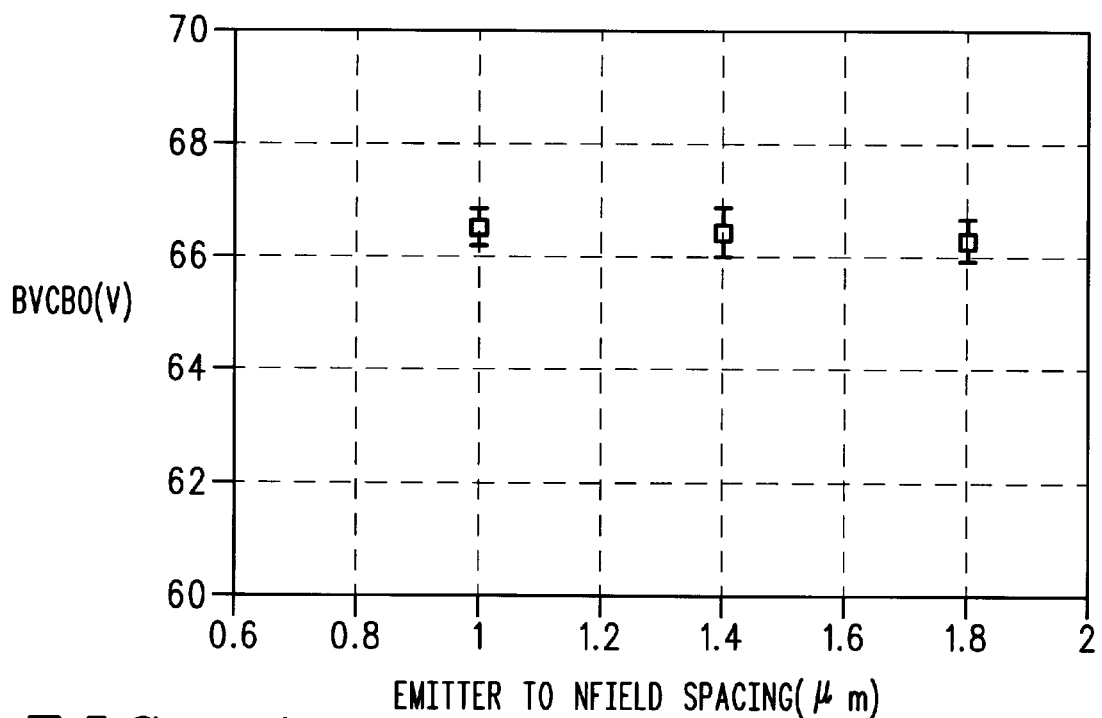

Referring to FIG. 4, a graph is illustrated showing the dependence of the breakdown voltage between the collector and the base for bipolar transistor 10 (hereinafter BVCBO is used for convenience) on spacing 36 between emitter 30 and implant 25, with spacing 37 held constant at approximately 1.0 $\mu$m. As can be seen, spacing 36 has very little or no effect on BVCBO.

Figure 5:
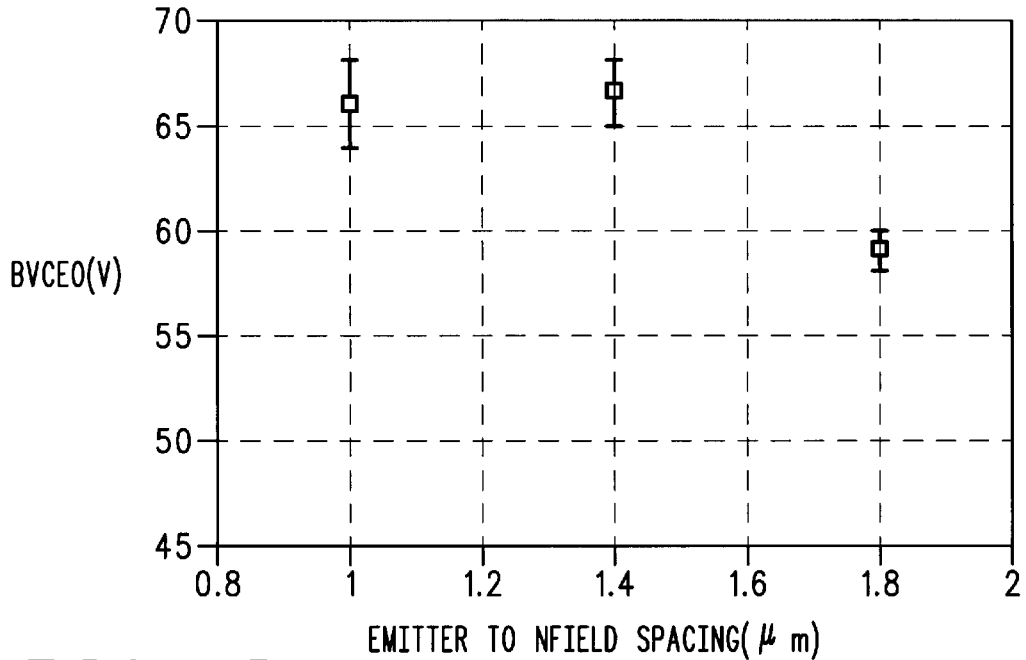

Referring to FIG. 5, a graph is illustrated showing the dependence of BVCEO for bipolar transistor 10 on spacing 36 between emitter 30 and implant 25. As can be seen, spacing 36 has very little or no effect until a maximum spacing is reached. Beyond a spacing of approximately 1.6 $\mu$m, in this specific embodiment, BVCEO drops significantly. Thus, with an appropriate selection for spacing 36, BVCEO can be increased and the variation reduced or eliminated while maintaining beta substantially constant.

Figure 6:
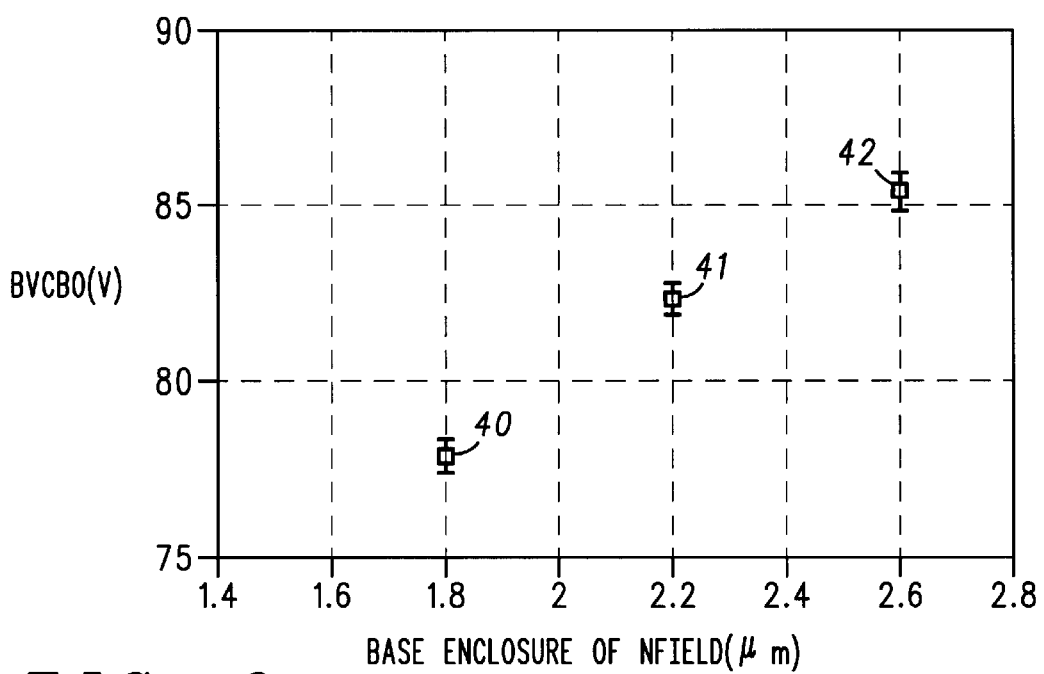

Referring now to FIG. 6, a graph is illustrated showing the dependence of BVCBO on spacing 37 and also on spacing 36. In the graph of FIG. 6, the horizontal axis shows spacing 37 while the vertical axis shows BVCBO. Also, three different points (40, 41, and 42) are illustrated with each point representing a different amount for spacing 36. Thus, at point 40, spacing 36 is 1.8 $\mu$m, spacing 37 is 1.8 $\mu$m, and BVCBO is approximately 78 volts. At point 41, spacing 36 is 1.4 $\mu$m, spacing 37 is 2.2 $\mu$m, and BVCBO is approximately 82 volts. At point 42, spacing 36 is 1.0 $\mu$m, spacing 37 is 2.6 $\mu$m, and BVCBO is approximately 85 volts. Since a BVCBO of approximately 66 volts is adequate for the intended applications (see FIG. 4), spacing 37 can generally be equal to or somewhat greater than 1.0 $\mu$m to provide an adequate BVCBO for the intended applications. The above described spacings were devised for a specific application and it should be understood that the spacings are adjustable for different applications.

In some prior devices, the breakdown path and the current path become mixed with the result that the collector to emitter breakdown voltage is much less than the collector to base breakdown voltage. In the present process an implant is included to separate the breakdown path from the current path. Also, in some prior devices Boron out-diffusion into an overlying layer, such as an oxide, nitride, or field oxide, produces a lateral junction that greatly affects the characteristics of the transistor and essentially magnifies the results of variations in the fabrication process. In the present process the implant is included to restrict the extent of the lateral junction so that any variations in the fabrication process have a lesser impact. Thus, by properly positioning the implant in the base region the transistor has more stable electrical characteristics. Because of the novel implant in the base region, an improvement in BVCEO is realized and the fabrication process is more tolerant of minor variations. The implant step described above to achieve implant 25 is already used, for example, in the standard process in this preferred embodiment as a field implant for n-channel CMOS devices.

While we have shown and described a specific embodiment of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a bipolar transistor in an integrated circuit comprising:

providing a semiconductor wafer with a surface;

forming a collector area with a first conductivity type in a portion of the semiconductor wafer adjacent the surface;

forming a base area with a second conductivity type in the collector area, the base area being formed with an outer periphery and a lower extremity and the lower extremity of the base area being spaced from and within a lower extremity of the collector area;

forming an emitter in the base area adjacent the surface of the semiconductor wafer and spaced from the outer periphery and the lower extremity of the base area;

implanting a second conductivity type implant in the base area adjacent the surface of the semiconductor wafer and positioning the implant to have a first predetermined separation distance between the emitter and to have a second predetermined separation distance between the outer periphery of the base area; and sizing the first predetermined separation distance and the second predetermined separation distance to have at least predetermined minimum values of current gain, beta, of the bipolar transistor and breakdown voltages of collector/emitter and collector/base junctions of the bipolar transistor.

2. The method of fabricating a bipolar transistor in an integrated circuit as claimed in claim 1, further comprising: doping the first conductivity type as N and doping the second conductivity type as P.

3. The method of fabricating a bipolar transistor in an integrated circuit as claimed in claim 1, further comprising:

introducing Boron with a first concentration into the portion of the semiconductor wafer adjacent the surface defining the collector area.

4. The method of fabricating a bipolar transistor in an integrated circuit as claimed in claim 3 wherein implanting the second conductivity type implant in the base area further comprises implanting Boron with a second concentration heavier than the first concentration.

5. The method of fabricating a bipolar transistor in an integrated circuit as claimed in claim 4 wherein introducing Boron with the first concentration includes implanting a dose of Boron approximately $1.6E13$ $cm^{-2}$ and implanting the Boron includes implanting a dose of Boron of approximately $4E13$ $cm^{-2}$.

6. The method of fabricating a bipolar transistor in an integrated circuit as claimed in claim 5 wherein implanting the dose of Boron of approximately $1.6E13$ $cm^{-2}$ includes implanting at approximately 120 KeV and implanting a dose of Boron of approximately $4E13$ $cm^{-2}$ includes implanting at approximately 25 KeV.

7. The method of fabricating a bipolar transistor in an integrated circuit as claimed in claim 1 further comprising positioning a collector contact adjacent the surface of the semiconductor wafer and in electrical contact with the collector area, and spacing the collector contact from the base area.

8. The method of fabricating a bipolar transistor in an integrated circuit as claimed in claim 1 wherein implanting the implant further comprises positioning the implant to extend along opposed sides of the emitter.

9. The method of fabricating a bipolar transistor in an integrated circuit as claimed in claim 1 wherein implanting a second conductivity type implant further comprises substantially simultaneously using a common implant mask for both implanting the second conductivity type implant and for performing other implants in the integrated circuit.

10. The method of fabricating a bipolar transistor in an integrated circuit as claimed in claim 1 further comprising implanting the second conductivity type implant and forming an emitter in any convenient order, and positioning a field oxide on the surface of the semiconductor wafer.

11. The method of fabricating a bipolar transistor in an integrated circuit as claimed in claim 1 further comprising positioning a field oxide on the surface of the semiconductor wafer surrounding the emitter and substantially covering the base area and the implant.

* * * * *